(12) United States Patent
Smith

(10) Patent No.: US 11,143,791 B2
(45) Date of Patent: Oct. 12, 2021

(54) MESOSCALE MODELING

(71) Applicant: User-Centric IP, L.P., State College, PA (US)

(72) Inventor: Michael R. Smith, Wichita, KS (US)

(73) Assignee: User-Centric IP, L.P., State College, PA (US)

( * ) Notice: Subject to any disclaimer, the term of this patent is extended or adjusted under 35 U.S.C. 154(b) by 398 days.

(21) Appl. No.: 14/757,366

(22) Filed: Dec. 22, 2015

(65) Prior Publication Data

US 2016/0231463 A1    Aug. 11, 2016

Related U.S. Application Data

(60) Provisional application No. 62/095,736, filed on Dec. 22, 2014.

(51) Int. Cl.
*G01W 1/10*    (2006.01)
*G06F 30/20*    (2020.01)
*G06F 17/18*    (2006.01)

(52) U.S. Cl.
CPC .............. *G01W 1/10* (2013.01); *G06F 17/18* (2013.01); *G06F 30/20* (2020.01); *F05B 2260/8211* (2013.01); *F05B 2260/84* (2013.01); *G01W 2201/00* (2013.01); *G01W 2203/00* (2013.01); *G06T 2207/30192* (2013.01)

(58) Field of Classification Search
CPC ...................................................... G01W 1/10
See application file for complete search history.

(56) References Cited

U.S. PATENT DOCUMENTS

| 4,792,806 | A | | 12/1988 | Bent et al. |
| 4,914,444 | A | | 4/1990 | Pifer et al. |
| 4,996,473 | A | | 2/1991 | Markson et al. |
| 5,140,419 | A | | 8/1992 | Galumbeck et al. |
| 5,355,140 | A | | 10/1994 | Slavin et al. |
| 5,508,930 | A | | 4/1996 | Smith, Jr. |
| 5,583,972 | A | * | 12/1996 | Miller ................... G01S 13/951 345/419 |
| 5,628,050 | A | | 5/1997 | McGraw et al. |
| 5,699,056 | A | | 12/1997 | Yoshida |

(Continued)

FOREIGN PATENT DOCUMENTS

| CA | 2158335 | 12/2007 |
| JP | 2008008772 A | 1/2008 |
| JP | 2008008772 A | 1/2008 |

OTHER PUBLICATIONS

James M. Frederick et al., "A New Approach to Local Modeling," National Weather Service Forecast Office, Tulsa, Oklahoma; 23rd Conference on Weather Analysis and Forecasting/19th; JP 1.11, Jun. 1, 2009, 5 Pages.

(Continued)

*Primary Examiner* — Akash Saxena
(74) *Attorney, Agent, or Firm* — Perkins Coie LLP; Drew Schulte

(57) ABSTRACT

A mesoscale modeling system and method that enables meteorologists to adjust forecasts to account for known biases of weather forecasting models and outputs high-resolution images consistent with the adjusted forecasts. The mesoscale modeling system and method may also use a weather forecasting model to forecast future weather events based on one or more adjustments provided by the meteorologists.

16 Claims, 15 Drawing Sheets

(56) References Cited

U.S. PATENT DOCUMENTS

| | | | |
|---|---|---|---|
| 5,724,255 | A | 3/1998 | Smith et al. |
| 5,848,373 | A | 12/1998 | DeLorme et al. |
| 5,867,110 | A | 2/1999 | Naito et al. |
| 5,914,675 | A | 6/1999 | Tognazzini |
| 5,959,567 | A | 9/1999 | Wolfson et al. |
| 5,991,687 | A | 11/1999 | Hale et al. |
| 6,009,374 | A | 12/1999 | Urahashi |
| 6,018,699 | A | 1/2000 | Baron, Sr. et al. |
| 6,031,455 | A | 2/2000 | Grube et al. |
| 6,084,510 | A | 7/2000 | Lemelson et al. |
| 6,112,074 | A | 8/2000 | Pinder |
| 6,125,328 | A | 9/2000 | Baron et al. |
| 6,154,699 | A | 11/2000 | Wililams |
| 6,167,255 | A | 12/2000 | Kennedy, III et al. |
| 6,198,390 | B1 | 3/2001 | Schlager et al. |
| 6,199,045 | B1 | 3/2001 | Giniger et al. |
| 6,240,365 | B1 | 5/2001 | Bunn |
| 6,240,369 | B1 | 5/2001 | Foust |
| 6,252,544 | B1 | 6/2001 | Hoffberg |
| 6,255,953 | B1 | 7/2001 | Barberg |
| 6,289,331 | B1 | 9/2001 | Pedersen et al. |
| 6,295,001 | B1 | 9/2001 | Barber |
| 6,304,816 | B1 | 10/2001 | Berstis |
| 6,351,218 | B1 | 2/2002 | Smith |
| 6,400,996 | B1 | 6/2002 | Hoffberg et al. |
| 6,405,134 | B1 | 6/2002 | Smith et al. |
| 6,429,812 | B1 | 8/2002 | Hoffberg |
| 6,505,123 | B1 | 1/2003 | Root et al. |
| 6,529,890 | B1* | 3/2003 | Pandit ................ G06N 5/00 706/47 |
| 6,542,825 | B2 | 4/2003 | Jones et al. |
| 6,581,009 | B1 | 6/2003 | Smith |
| 6,603,405 | B2 | 8/2003 | Smith |
| 6,604,816 | B1 | 8/2003 | Yonekura et al. |
| 6,645,559 | B2 | 11/2003 | Smith |
| 6,646,559 | B2 | 11/2003 | Smith |
| 6,754,585 | B2 | 6/2004 | Root et al. |
| 6,792,615 | B1 | 9/2004 | Rowe et al. |
| 6,826,481 | B2 | 11/2004 | Root et al. |
| 6,836,730 | B2 | 12/2004 | Root et al. |
| 6,845,324 | B2 | 1/2005 | Smith |
| 6,865,539 | B1 | 3/2005 | Pugliese |
| 6,941,126 | B1 | 9/2005 | Jordan, Jr. |
| 6,947,842 | B2 | 9/2005 | Smith et al. |
| 6,963,853 | B1 | 11/2005 | Smith |
| 6,980,909 | B2 | 12/2005 | Root et al. |
| 6,985,813 | B2 | 1/2006 | Root et al. |
| 6,988,037 | B2 | 1/2006 | Root et al. |
| 7,024,310 | B2 | 4/2006 | Root et al. |
| 7,082,382 | B1* | 7/2006 | Rose, Jr. ............... G01W 1/02 702/183 |
| 7,089,116 | B2 | 8/2006 | Smith |
| 7,248,159 | B2 | 7/2007 | Smith |
| 7,250,952 | B2* | 7/2007 | Johnson ............... G06T 15/503 345/473 |
| 7,792,664 | B1* | 9/2010 | Crawford ............... G01W 1/10 702/3 |
| 8,160,995 | B1 | 4/2012 | Crawford et al. |
| 9,207,098 | B2* | 12/2015 | Rings ................ G01C 21/3691 |
| 9,310,517 | B2* | 4/2016 | Kirby ................ G01W 1/10 |
| 10,267,951 | B2* | 4/2019 | Lemos ................ G06Q 50/02 |
| 10,318,558 | B2* | 6/2019 | Cipriani ............... G06F 16/29 |
| 10,859,731 | B2* | 12/2020 | Averbuch ............... G06Q 10/04 |
| 2002/0042846 | A1 | 4/2002 | Bottan et al. |
| 2002/0067289 | A1* | 6/2002 | Smith ................ G08G 1/0962 340/905 |
| 2002/0188522 | A1 | 12/2002 | McCall et al. |
| 2003/0004780 | A1 | 1/2003 | Smith |
| 2003/0100259 | A1 | 5/2003 | Sinclair |
| 2004/0043760 | A1* | 3/2004 | Rosenfeld ............... H04L 67/16 455/414.3 |
| 2004/0049345 | A1 | 3/2004 | McDonough et al. |
| 2004/0181340 | A1* | 9/2004 | Smith ................ G08B 21/10 702/3 |
| 2004/0215394 | A1 | 10/2004 | Carpenter et al. |
| 2004/0225556 | A1* | 11/2004 | Willen ............... G06Q 30/0202 705/7.31 |
| 2005/0010365 | A1* | 1/2005 | Chapman ............... G01S 19/14 702/3 |
| 2005/0050008 | A1 | 3/2005 | Root et al. |
| 2005/0086004 | A1 | 4/2005 | Smith |
| 2005/0197775 | A1* | 9/2005 | Smith ................ G08B 21/10 702/3 |
| 2005/0240378 | A1 | 10/2005 | Smith et al. |
| 2006/0015254 | A1 | 1/2006 | Smith |
| 2006/0080039 | A1 | 4/2006 | Root et al. |
| 2006/0161469 | A1 | 7/2006 | Root et al. |
| 2006/0178269 | A1 | 8/2006 | Smith |
| 2006/0241865 | A1 | 10/2006 | Smith |
| 2008/0097701 | A1* | 4/2008 | Zawadzki ............... G01W 1/10 702/3 |
| 2008/0100625 | A1* | 5/2008 | Johnson ................ H04N 5/272 345/473 |
| 2010/0268519 | A1* | 10/2010 | Henning ............ G01N 33/0075 703/6 |
| 2011/0029243 | A1* | 2/2011 | Gallagher ............... G01W 1/00 702/3 |
| 2013/0024118 | A1* | 1/2013 | Gershunov ............. G01W 1/10 702/3 |
| 2014/0024529 | A1* | 1/2014 | Smith ................ C05F 5/008 504/117 |
| 2014/0030695 | A1* | 1/2014 | Smith ................ C12M 41/48 435/3 |
| 2014/0181340 | A1 | 6/2014 | Parthasarathy et al. |
| 2014/0222321 | A1* | 8/2014 | Petty ................ G01C 21/3492 701/117 |
| 2014/0347181 | A1* | 11/2014 | Luna ................ H04M 1/72454 340/539.22 |
| 2014/0358486 | A1* | 12/2014 | Osborne ................ A01G 7/00 702/189 |
| 2014/0372038 | A1* | 12/2014 | LeBlanc ............ G01C 21/3461 702/3 |
| 2016/0231463 | A1* | 8/2016 | Smith ................ G06F 30/20 |
| 2017/0249056 | A1* | 8/2017 | Rainey ................ G06F 16/9537 |
| 2018/0038994 | A1* | 2/2018 | Hamann ................ G01W 1/10 |
| 2018/0292826 | A1* | 10/2018 | DeFelice ............ G08G 5/0091 |

OTHER PUBLICATIONS

Maptech Pocket Navigator, printed from <http://www.mapteach.com/products/PocketNavigator/index.cfm> on May 29, 2003, 19 pages.

Maptech Outdoor Navigator, printed from <http://www.maptech.com/products/OutdoorNavigator/index.cfm> on May 29, 2003, 8 pages.

Teletype GPS, WorldNavigator, 2002, 2 pages.

TeleType GPS—Street Level Maps, printed from <http://www.teletype.com/pages/gps/street.html> printed on May 29, 2003, 4 pages.

Microsoft Streets & Trips 2003, printed from <http://www.microsoft.com/streets> printed on May 29, 2003, 11 pages.

Navigation Solutions, printed from <http://hertzneverlost.com> on May 29, 2003, 7 pages.

Control Vision, printed from <http://www.anywheremap.com> on May 29, 2003, 6 pages.

Notification of Transmittal of the International Search Report and the Written Opinion of the International Searching Authority, or the Declaration, dated Apr. 18, 2016, 10 pages.

Office Action for Canadian application No. 2,460,270, dated Dec. 22, 2010, 2 Pages.

James M. Frederick, et al., "A New Approach to Local Modeling", National Weather Service Forecast Office, Tulsa, Oklahoma, JP 1.11; 5 pages.

Spreitzhofer et al., "Application of post-processing tools to improve visualisation and quality of numerical short-range predictions over Central Europe," Meteorol. Appl. 4, 219-228 (1997).

G. Spreitzhofer; "Application of post-processing tools to improve visualization and quality of numerical short-range predictions over Central Europe"; Meteorological Applications, vol. 4, 1997; pp. 219-228.

(56) References Cited

OTHER PUBLICATIONS

English translation; Japan Published Application No. 2008008772; Publication Date: Jan. 17, 2008; 5 pages.

* cited by examiner

MESOSCALE MODELING

CROSS REFERENCE TO RELATED APPLICATION

This application claims priority to U.S. Provisional Patent Application No. 62/095,736, filed Dec. 22, 2014, the entire contents of which are hereby incorporated by reference.

BACKGROUND

Weather forecasting models each use a mathematical model of the atmosphere and oceans to forecast future weather conditions based on current weather conditions. Forecasts of future weather conditions may be output in the form of high resolution (still or moving) images that may be overlaid over a map or satellite image of a geographic area to graphically depict the predicted future weather conditions for the geographic area. Those high resolution images may be used as part of a television broadcast (such as a local news broadcast), published online (e.g., at AccuWeather.com), or distributed to the customers of weather forecasting companies.

Weather systems that are smaller than approximately 50 miles (or 60 kilometers) are generally referred to as "mesoscale" weather systems. Mesoscale weather systems are distinguished from larger "synoptic scale" weather systems and smaller "microscale" weather systems, which are short-lived atmospheric phenomena with widths of about 1 mile (or 1 km) or less.

No single weather forecasting model provides the most accurate forecasts of all mesoscale weather systems. Instead, each weather forecasting model has one or more biases. For example, when a mesoscale weather system is coming out of the southwestern United States (i.e., the Grand Canyon region) towards Kansas, Missouri, and Iowa, the Global Forecast System (GFS) model is known to output a long range forecast in which the predicted location of the mesoscale weather system is approximately 150 miles east of its most likely location. When preparing a forecast, an experienced meteorologist will often adjust for that bias by moving the forecasted location of a mesoscale weather system to the west.

In another example, Kansas and Oklahoma are often more humid in the spring than weather forecasting models predict. In other words, moisture often moves north from the Gulf of Mexico earlier than the weather forecasting models predict. As a result, thunderstorms can occur in Kansas and Oklahoma that are either not predicted by weather forecasting models or are predicted to occur farther east than their actual westernmost location. If an experienced meteorologist determines that a thunderstorm is likely to occur in Kansas and/or Oklahoma, the meteorologist adjusts for the known bias in the weather forecasting models by adding a mesoscale weather system (in this instance, a thunderstorm) where the meteorologist determines to be the most likely location.

A meteorologist will often prepare a forecast by mentally combining the forecasts of multiple weather forecasting models and adjusting for the biases of each individual weather forecasting model.

When the forecasts of weather forecasting models are mentally adjusted or combined, the high resolution images do not accurately reflect the meteorologist's forecast because the high resolution images still reflect the biases of the weather forecasting models. Instead, the meteorologist must graphically depict a forecast by drawing polygons either by hand or using computer-aided design tools. Accordingly, while a meteorologist's hand-drawn forecast may be more accurate than what is provided by the weather forecasting models, the meteorologist's hand-drawn forecast lacks the high resolution detail provided by the weather forecasting models. A television meteorologist may even disagree with the high resolution forecast being depicted on screen, for example by describing a forecasted thunderstorm that is not graphically depicted based on the output of the weather forecasting model.

Additionally, if a meteorologist makes an adjustment to the forecast of an existing weather forecasting model, those existing weather forecasting models cannot make additional forecasts based on the meteorologist's adjustment. For example, an existing weather forecasting model may forecast weather conditions every six hours. After three hours, it may become apparent that the forecast was inaccurate. Existing weather forecasting models cannot be re-run with additional information correcting the inaccuracy. Instead, meteorologists must wait until the six-hour period has elapsed before the existing weather forecasting system forecasts weather conditions based on the accurate weather conditions.

Accordingly, there is a need for a mesoscale modeling system and method that enables meteorologists to adjust forecasts to account for known biases of weather forecasting models and outputs high-resolution images consistent with the adjusted forecasts. There is also a need for a mesoscale modeling system and method that uses a weather forecasting model to forecast future weather events based on one or more adjustments to one or multiple models provided by the meteorologists.

SUMMARY

In order to overcome these and other disadvantages in the related art, there is provided a mesoscale modeling system and method that enables meteorologists to adjust forecasts to account for known biases of weather forecasting models and outputs high-resolution images consistent with the adjusted forecasts. The mesoscale modeling system and method may also use a weather forecasting model to forecast future weather events based on one or more adjustments provided by the meteorologists.

BRIEF DESCRIPTION OF THE DRAWINGS

Aspects of exemplary embodiments may be better understood with reference to the accompanying drawings. The components in the drawings are not necessarily to scale, emphasis instead being placed upon illustrating the principles of exemplary embodiments.

DETAILED DESCRIPTION OF THE INVENTION

Figure 1:
FIG. 1 is a drawing illustrating a graphical user interface output by a mesoscale modeling system according to an exemplary embodiment of the present invention.

Reference to the drawings illustrating various views of exemplary embodiments of the present invention is now made. In the drawings and the description of the drawings herein, certain terminology is used for convenience only and is not to be taken as limiting the embodiments of the present invention. Furthermore, in the drawings and the description below, like numerals indicate like elements throughout.

FIG. 1 is a drawing illustrating a view 100 output by a graphical user interface of a mesoscale modeling system according to an exemplary embodiment of the present invention. As described in more detail below, the mesoscale modeling system enables meteorologists to adjust forecasts of mesoscale weather systems to account for a known bias and outputs high-resolution images consistent with the meteorologists' adjusted mesoscale forecasts. The mesoscale modeling system also allows meteorologists to use a weather forecasting model to forecast future weather events based on the adjustments provided by the meteorologists.

Figure 2:
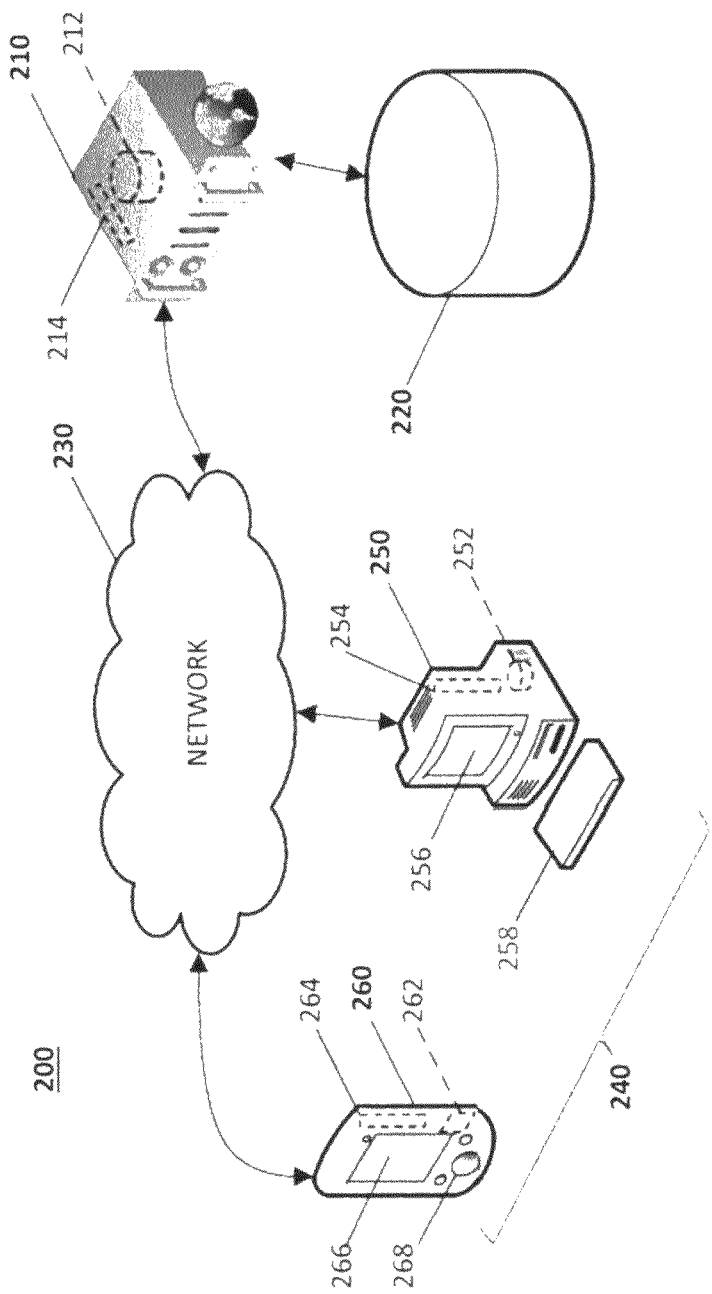
FIG. 2 is a drawing illustrating an overview of the architecture of the mesoscale modeling system according to an exemplary embodiment of the present invention.

FIG. 2 is a drawing illustrating an overview of the architecture 200 of the mesoscale modeling system. The architecture 200 may include one or more servers 210 and one or more storage devices 220 connected to a plurality of remote computer systems 240, such as one or more personal systems 250 and one or more mobile computer systems 260, via one or more networks 230.

The one or more servers 210 may include an internal storage device 212 and a processor 214. The one or more servers 210 may be any suitable computing device including, for example, an application server and a web server which hosts websites accessible by the remote computer systems 240. The one or more storage devices 220 include external storage devices and/or the internal storage device 212 of the one or more servers 210. The one or more storage devices 220 may include any non-transitory computer-readable storage medium, such as an external hard disk array or solid-state memory. The networks 230 may include any combination of the internet, cellular networks, wide area networks (WAN), local area networks (LAN), etc. Communication via the networks 230 may be realized by wired and/or wireless connections. A remote computer system 240 may be any suitable electronic device configured to send and/or receive data via the networks 230. A remote computer system 240 may be, for example, a network-connected computing device such as a personal computer, a notebook computer, a smartphone, a personal digital assistant (PDA), a tablet, a notebook computer, a portable weather detector, a global positioning satellite (GPS) receiver, network-connected vehicle, etc. A personal computer systems 250 may include an internal storage device 252, a processor 254, output devices 256 and input devices 258. The one or more mobile computer systems 260 may include an internal storage device 262, a processor 264, output devices 266 and input devices 268. An internal storage device 212, 252, and/or 262 may be non-transitory computer-readable storage mediums, such as hard disks or solid-state memory, for storing software instructions that, when executed by a processor 214, 254, or 264, carry out relevant portions of the features described herein. A processor 214, 254, and/or 264 may include a central processing unit (CPU), a graphics processing unit (GPU), etc. A processor 214, 254, and 264 may be realized as a single semiconductor chip or more than one chip. An output device 256 and/or 266 may include a display, speakers, external ports, etc. A display may be any suitable device configured to output visible light, such as a liquid crystal display (LCD), a light emitting polymer displays (LPD), a light emitting diode (LED), an organic light emitting diode (OLED), etc. The input devices 258 and/or 268 may include keyboards, mice, trackballs, still or video cameras, touchpads, etc. A touchpad may be overlaid or integrated with a display to form a touch-sensitive display or touchscreen.

The mesoscale modeling system may be realized by software instructions stored on one or more of the internal storage devices 212, 252, and/or 262 executed by one or more of the processors 214, 254, or 264.

Figure 3:
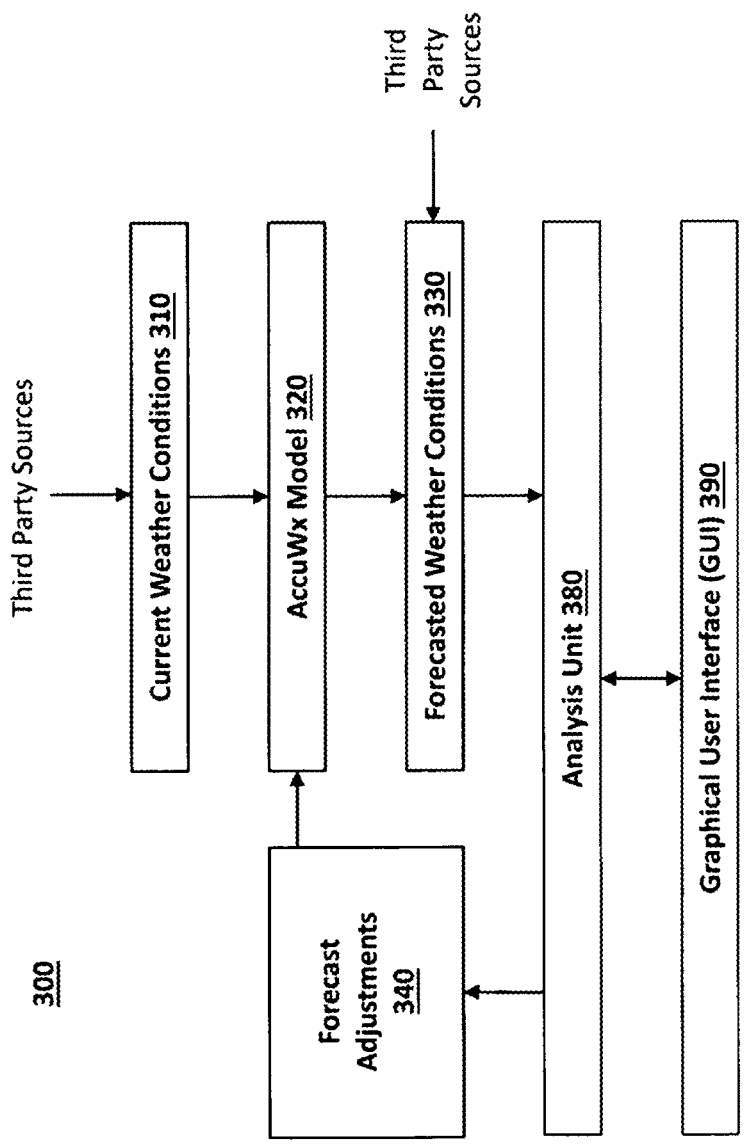
FIG. 3 is a block diagram of the mesoscale modeling system according to an exemplary embodiment of the present invention.

FIG. 3 is a block diagram of the mesoscale modeling system 300 according to an exemplary embodiment of the present invention. The mesoscale modeling system 300 may include current weather conditions 310, an AccuWeather weather forecasting model 320, forecasted weather conditions 330, forecast adjustments 340, an analysis unit 380, and a graphical user interface 390. The graphical user interface 390 may include a geographic information system designed to capture, store, manipulate, analyze, manage, and present geographical data.

The current weather conditions 310 may include any observation about the current state of the atmosphere. The current weather conditions 310 may include observations from weather satellites, radiosondes (e.g., in weather balloons), pilot reports along aircraft routes, ship reports along shipping routes, reconnaissance aircraft, etc. The current weather conditions 310 may be received from third party sources, such as governmental agencies (e.g., the National Weather Service (NWS), the National Hurricane Center (NHC), Environment Canada, the U.K. Meteorologic Service, the Japan Meteorological Agency, etc.), private companies (such as AccuWeather, Inc., AccuWeather Enterprise Solutions, Inc., Vaisalia's U.S. National Lightning Detection Network, Weather Decision Technologies, Inc.), individuals (such as members of the Spotter Network), etc. The current weather conditions 310 may be stored, for example, in the one or more storage devices 220.

The AccuWeather weather forecasting model 320 is a computer program that uses mathematical models of the atmosphere and/or oceans to forecast weather conditions based on the current weather conditions 310. (AC-CUWEATHER is a registered service mark of AccuWeather, Inc.) The AccuWeather weather forecasting model 320 also uses the same models to forecast weather conditions based on the forecast adjustments 340 input by the user as described below. The AccuWeather weather forecasting model 320 may be realized by software stored, for example, in the one or more storage devices 220 and executed, for example, by the one or more servers 210.

The forecasted weather conditions 330 may include any prediction regarding the future state of the atmosphere. The forecasted weather conditions 330 may be determined by the AccuWeather weather forecasting model 320. Additionally, the mesoscale modeling system 300 may receive forecasted weather conditions 330 determined by third party weather forecasting models, such as the National Oceanic and Atmospheric Administration (NOAA) Rapid Refresh (RAP) model, the High Resolution Rapid Refresh (HRRR) model, the NOAA North American Mesoscale (NAM) model, the NOAA high resolution 4 km North American Mesoscale (4 km NAM) model, the NOAA Short Range Ensemble Forecast (SREF) model, the NOAA Global Forecast System (GFS) model, the NOAA Global Ensemble Forecast System (GEFS) model, the NOAA Climate Forecast System (CFS) model, the European Centre for Mid-Range Weather Forecasts (ECMWF) model, the Japan Meteorological Agency (JMA) Global Spectral Model (GSM), the JMA Meso-Scale Model (MSM), the JMA Local Forecast Model (LFM), the National Severe Storms Laboratory NSSL 4 km Weather Research and Forecasting (WRF) model, the MeteoFrance Regional model, the National Weather Service (NWS) hurricane WRF model, the Environment Canada model, the Environment Canada ensemble, etc.

The forecasted weather conditions 330 may include the predicted location, intensity and duration of mesoscale weather systems. The mesoscale weather systems may include any weather system between about 1 mile (or 1 kilometer) and about 50 miles (or 60 kilometers) in width. The mesoscale weather systems may include winter storms (e.g., snowstorms, ice storms, hailstorms, blizzards), ocean storms, wind storms, sea breezes, squall lines, thunderstorms, mesoscale convective complexes, extratropical cyclones, nor'easters, tropical cyclones (e.g., tropical depressions, tropical storms, hurricanes, typhoons), derechos, tornados, etc. The locations of the mesoscale weather systems may be stored in a format such that the mesoscale weather systems may be viewed and analyzed by the geographic information system of the graphical user interface 390. The intensity of the mesoscale weather systems may be expressed in terms of amounts of rain or snow the mesoscale weather systems are forecasted to produce. The duration of the mesoscale weather systems may be expressed in terms of time that the mesoscale weather systems are forecasted to experience during each phase (e.g., birth, growth, decay). The forecasted weather conditions 330 may be stored, for example, in the one or more storage devices 220.

The forecast adjustments 340 include adjustments to the forecasted weather conditions 330 made by a user (e.g., a meteorologist) via the mesoscale modeling system 300. As described in more detail below, the mesoscale modeling system 300 enables the user to adjust the location, intensity and/or duration of the mesoscale weather systems included in the forecasted weather conditions 330. Additionally, the mesoscale modeling system 300 enables the user to combine the outputs of multiple weather forecasting models. Accordingly, the forecast adjustments 340 may include forecasted weather conditions determined based on a combination of two or more weather forecasting models. The forecast adjustments 340 may be stored, for example, in the one or more storage devices 220.

The analysis unit 380 is configured to adjust the forecasted weather conditions 330 and/or determine forecasted weather conditions based on the combination of two or more weather forecasting models based on input by the user via the graphical user interface 390. The analysis unit 320 may be realized by software stored, for example, in the one or more storage devices 220 and executed, for example, by the one or more servers 210.

The graphical user interface 390 may be any interface that allows a user to input information for transmittal to the mesoscale modeling system 300 and/or outputs information received from the mesoscale modeling system 300 to a user. The graphical user interface 390 may be realized by software instructions stored on and executed by a remote computer system 240.

Figure 4A:
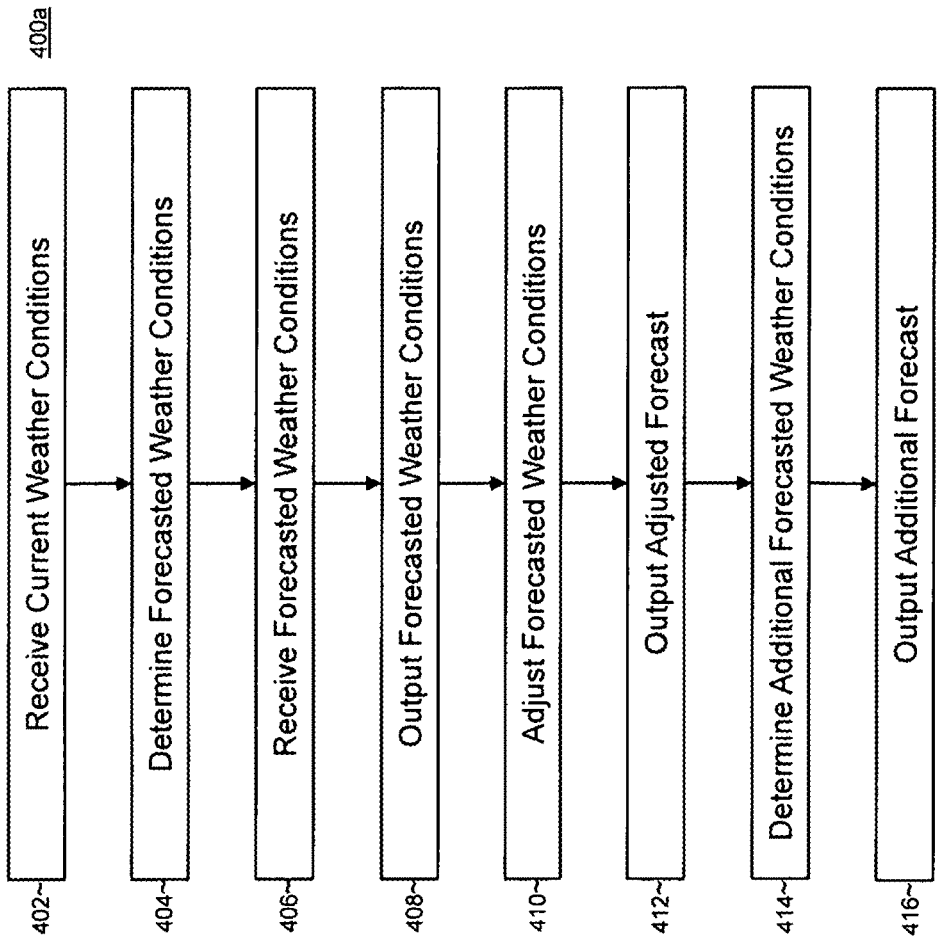
FIG. 4A is a flowchart illustrating a process according to an exemplary embodiment of the present invention.

FIG. 4A is a flowchart illustrating a process 400a according to an exemplary embodiment of the present invention.

The current weather conditions 310 are received in step 402. The current weather conditions 310 may be received from governmental agencies, private companies, individuals, etc.

Forecasted weather conditions 330 are determined by the AccuWeather weather forecasting model 320 in step 404. The forecasted weather conditions 330 may include the predicted location, intensity, and duration of mesoscale weather systems.

Forecasted weather conditions 330 are received from one or more third party sources in step 406. The forecasted weather conditions 330 received from one or more third party sources may be determined by one or more third party weather forecasting models.

The forecasted weather conditions 330 are output to a user via the graphical user interface 390 in step 408. The forecasted weather conditions 330 may be output via a geographic information system.

The forecasted weather conditions 330 are adjusted by the analysis unit 380 based on input from the user via the graphical user interface 390 in step 410. The user may adjust the forecasted weather conditions 330 by adjusting the predicted location, size, intensity, and/or duration of a mesoscale weather system. The user may adjust the intensity of the mesoscale weather system adjusting a predicted amount of rain and/or snow. The user may adjust the forecasted weather conditions 330 by adding a mesoscale weather system to the forecasted weather conditions 330. The user may adjust the forecasted weather conditions 330 by averaging the output of two or more of the weather forecasting models. The analysis unit 380 may average the output of two or more of the weather forecasting models by determining a predicted intensity of a mesoscale weather system by averaging the intensities predicted by the two or more weather forecasting models. Additionally or alternatively, the analysis unit 380 may average the output of two or more of the weather forecasting models by determining a predicted location of a mesoscale weather system by averaging the locations predicted by the two or more weather forecasting models.

An adjusted forecast is output via the graphical user interface 390 in step 412. The adjusted forecast includes the forecasted weather conditions 330 as adjusted by the user in step 410.

The AccuWeather weather forecasting model 320 determines additional forecasted weather conditions 330 in step 414 based on the user input received in step 410.

An additional forecast is output via the graphical user interface 390 in step 414. The additional forecast includes the additional weather conditions determined in step 412.

Figure 4B:
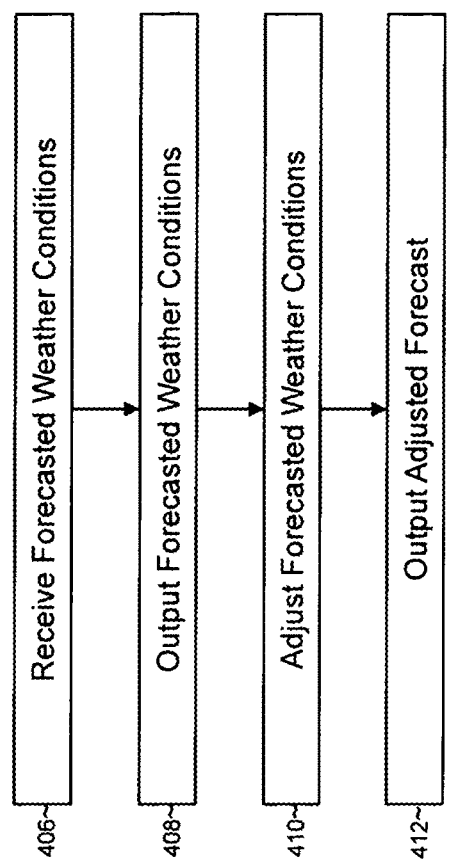
FIG. 4B is a flowchart illustrating a process according to another exemplary embodiment of the present invention.

FIG. 4B is a flowchart illustrating a process 400b according to another exemplary embodiment of the present invention. The process 400b includes some of the steps of the process 400a described above.

The forecasted weather conditions 330, as determined by one or more third party weather forecasting models, are received from one or more third party sources in step 406. The forecasted weather conditions 330 are output to a user by the graphical user interface 390 (e.g., via a geographic information system) in step 408. The forecasted weather conditions 330 are adjusted by the analysis unit 380 based on input from the user in step 410. An adjusted forecast, including the forecasted weather conditions as adjusted by the user, is output via the graphical user interface 390 in step 412.

Figure 4C:
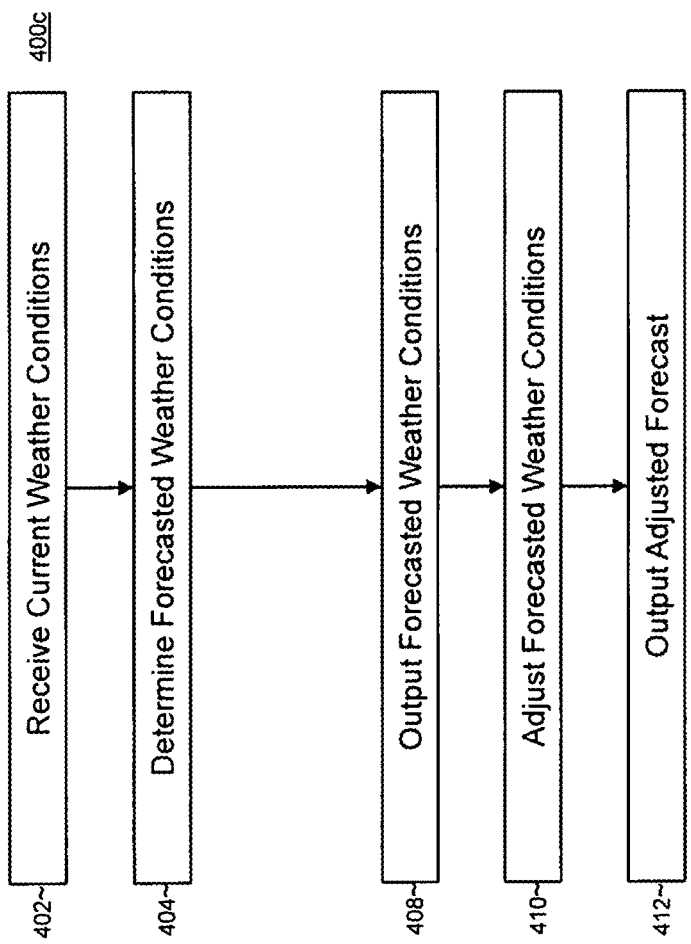
FIG. 4C is a flowchart illustrating a process according to another exemplary embodiment of the present invention.

FIG. 4C is a flowchart illustrating a process 400c according to another exemplary embodiment of the present invention. The process 400c includes some of the steps of the process 400a described above.

The current weather conditions 310 are received in step 402. The forecasted weather conditions 330 are determined by the AccuWeather weather forecasting model 320 in step 404.

The forecasted weather conditions 330 are output to a user by the graphical user interface 390 (e.g., via a geographic information system) in step 408. The forecasted weather conditions 330 are adjusted by the analysis unit 380 based on input from the user in step 410. An adjusted forecast, including the forecasted weather conditions as adjusted by the user, is output via the graphical user interface 390 in step 412.

Figure 4D:
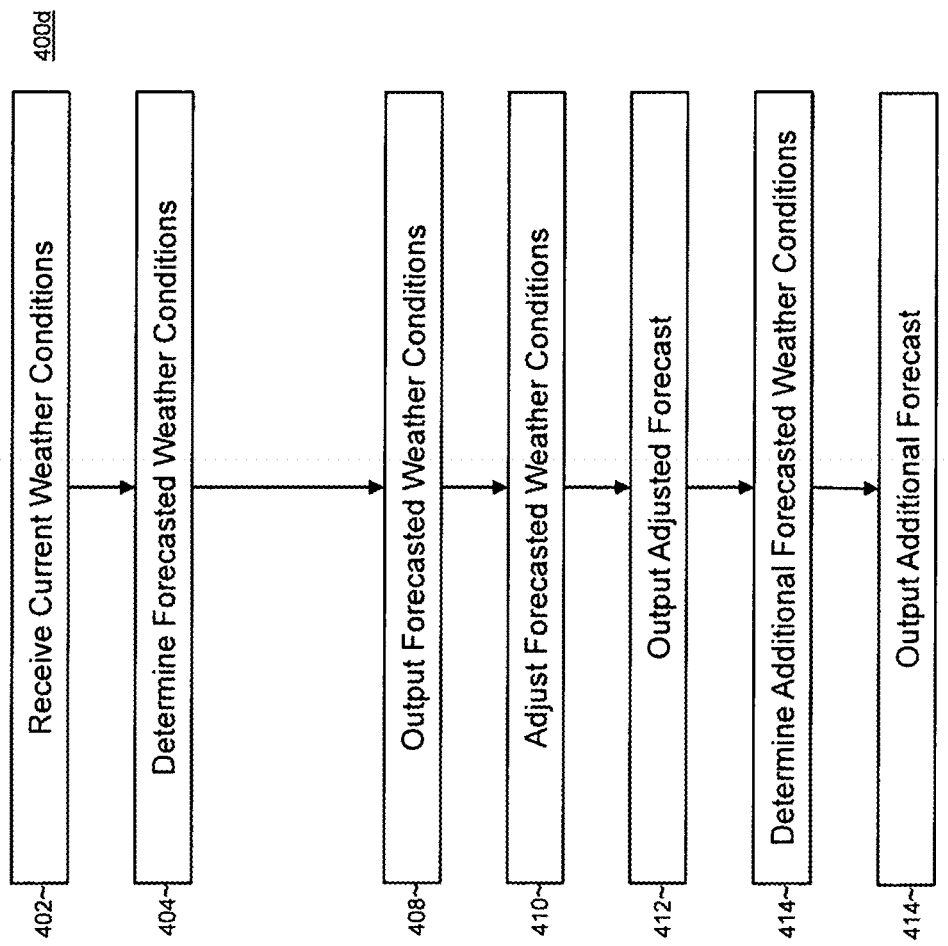
FIG. 4D is a flowchart illustrating a process according to another exemplary embodiment of the present invention.

FIG. 4D is a flowchart illustrating a process 400d according to another exemplary embodiment of the present invention. The process 400d includes some of the steps of the process 400a described above.

The current weather conditions 310 are received in step 402. The forecasted weather conditions 330 are determined by the AccuWeather weather forecasting model 320 in step 404. The forecasted weather conditions 330 are output to a user by the graphical user interface 390 (e.g., via a geographic information system) in step 408. The forecasted weather conditions 330 are adjusted by the analysis unit 380 based on input from the user in step 410. An adjusted forecast, including the forecasted weather conditions as adjusted by the user, is output via the graphical user interface 390 in step 412. The AccuWeather weather forecasting model 320 determines additional forecasted weather conditions 330 in step 414 based on the user input received in step 410. An additional forecast, including the additional weather conditions determined in step 412, is output by the graphical user interface 390 in step 414.

Figure 5:
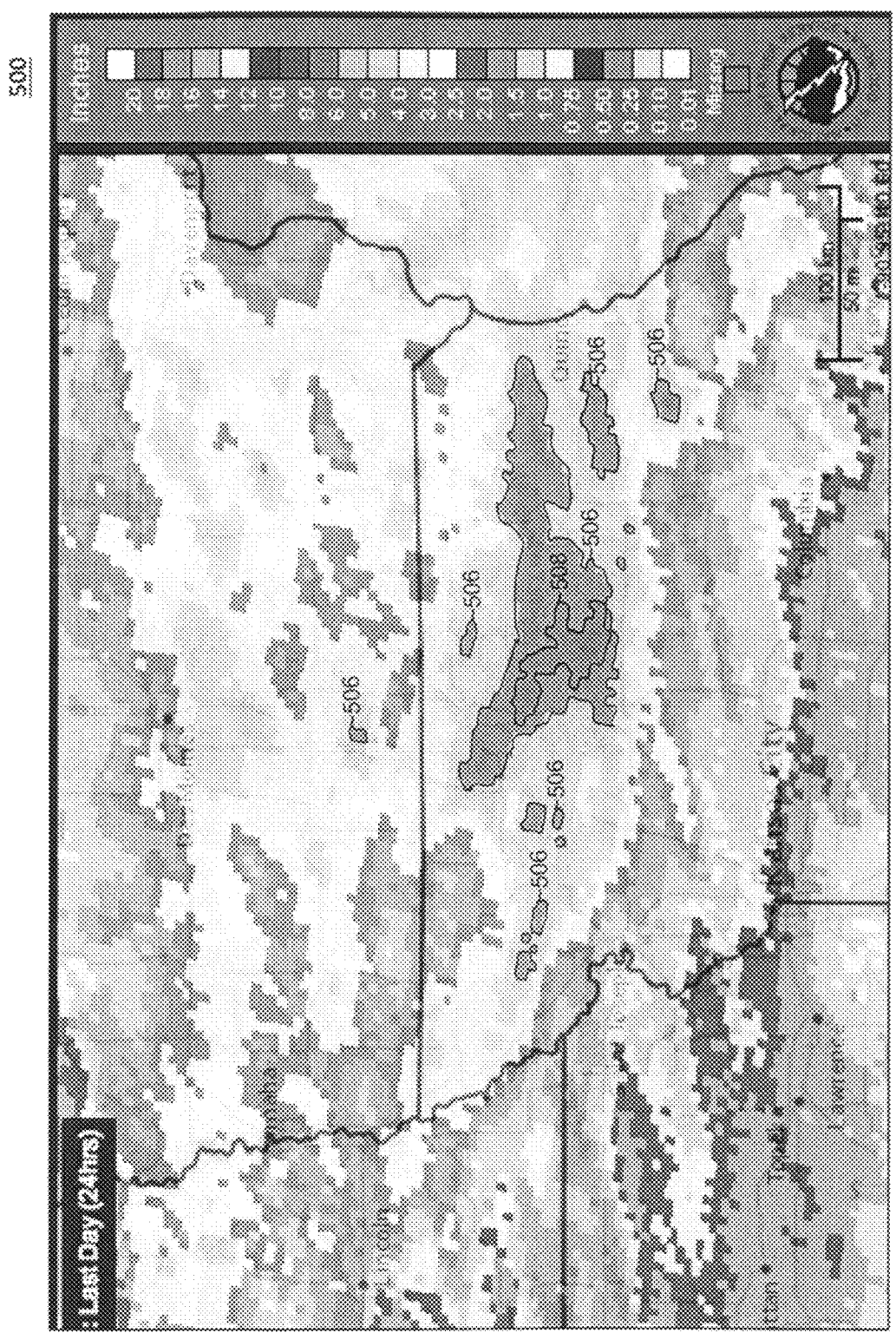
FIG. 5 is a drawing illustrating the actual rainfall during a flash flood event that took place in Missouri and Iowa.

FIG. 5 is a drawing illustrating the actual rainfall 500 during a flash flood event that took place in Missouri and Iowa between 5 pm and 5 am. As shown in FIG. 5, geographic areas 506 received between 6 and 8 inches of rain while geographic area 508 received between 8 and 10 inches of rain.

Figure 6:
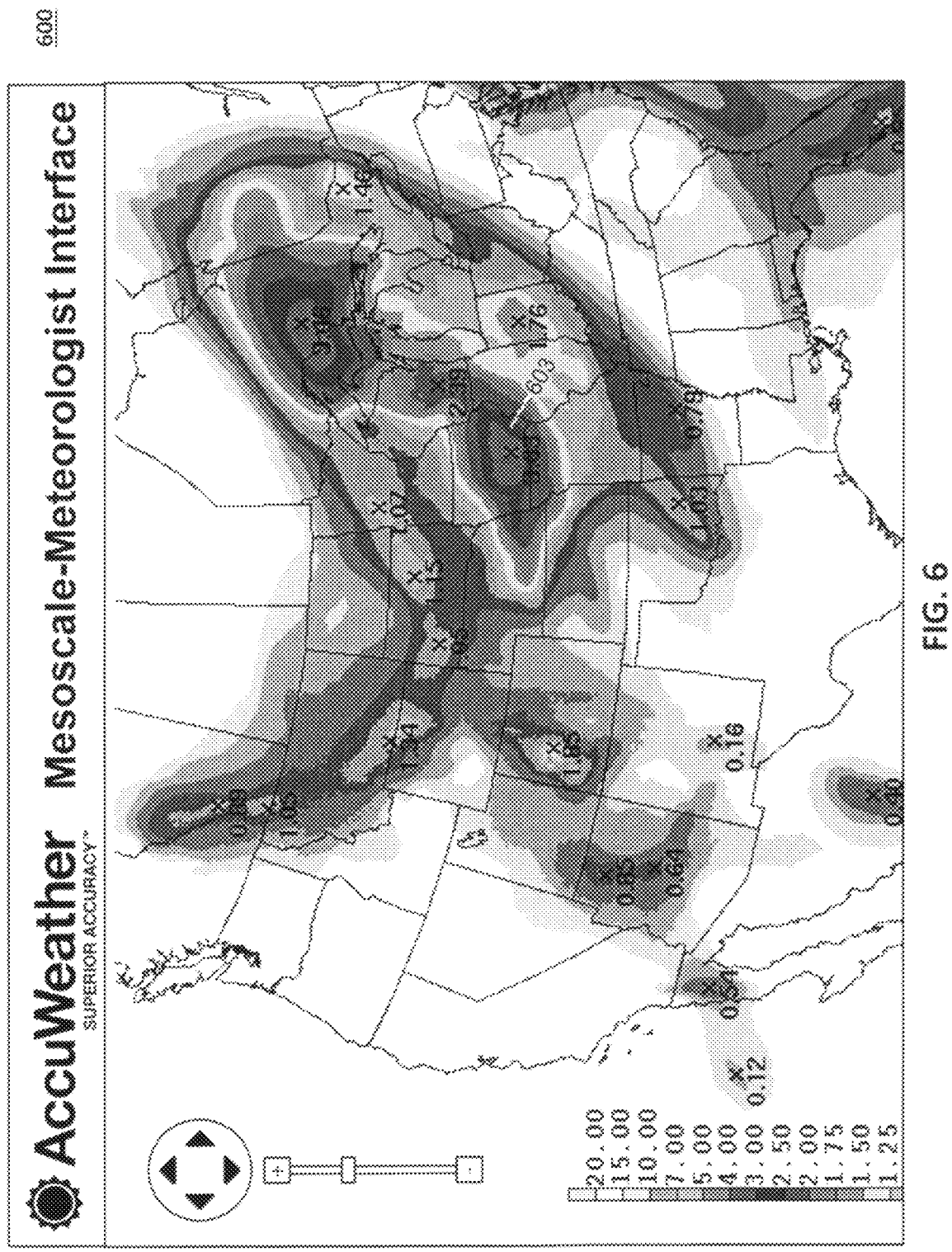
FIG. 6 is a drawing illustrating a National Weather Service (NWS) forecast output prior to the flash flood event illustrated in FIG. 5.

FIG. 6 is a drawing illustrating a National Weather Service (NWS) forecast 600 output at 9:45 am prior to the flash flood event illustrated in FIG. 5. As shown in FIG. 6, the heaviest rain predicted for Missouri and Iowa by the NWS forecast 600 was only 3.63 inches in geographic area 603. Also, the NWS forecast 600 predicted that the heaviest rain in Missouri and Iowa, as indicated by geographic area 603, would be farther North than the actual location of the heaviest rain, as indicated by geographic areas 506 and 508 as illustrated in FIG. 5.

Figure 7:
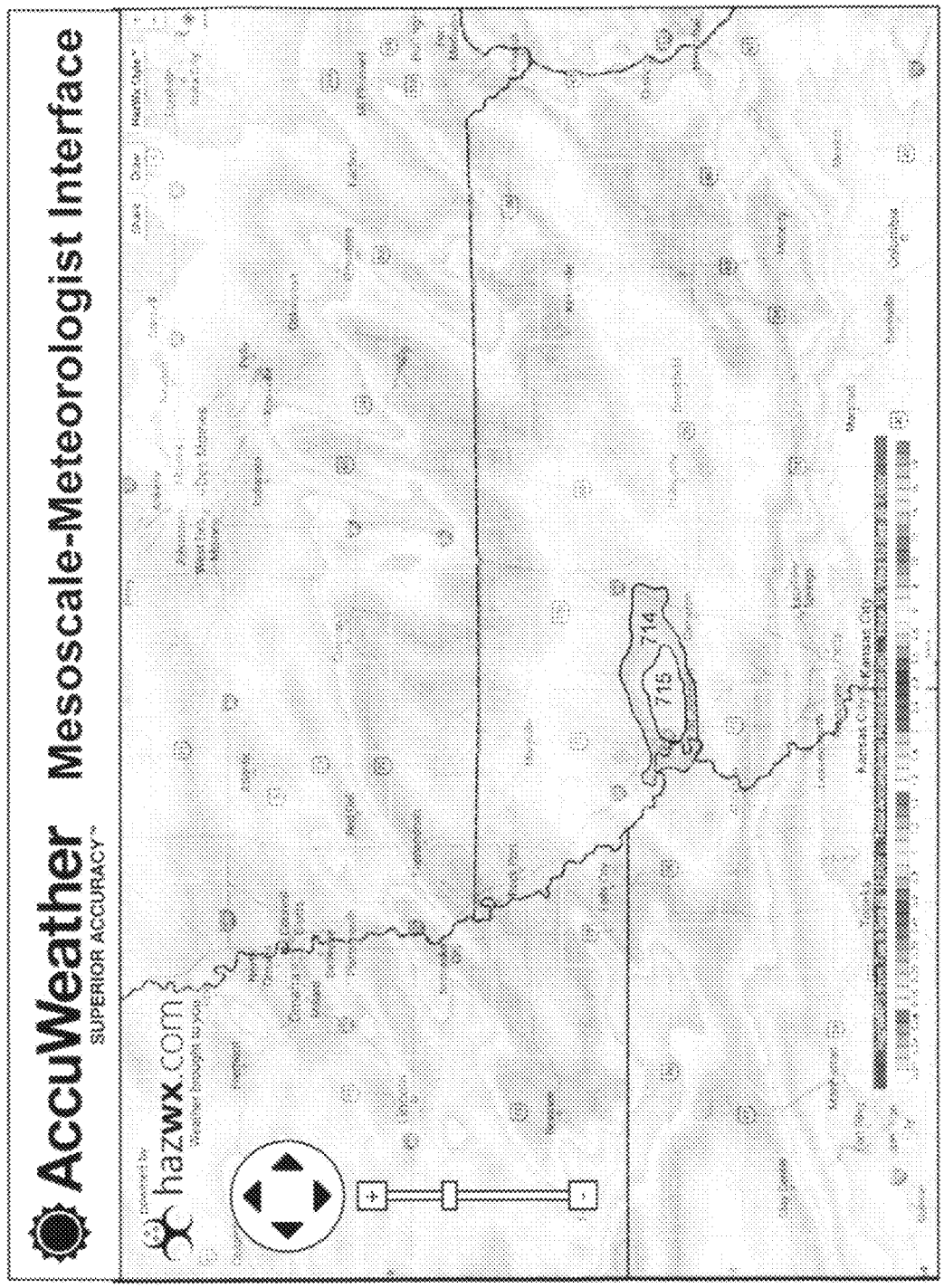
FIG. 7 is a drawing illustrating an AccuWeather forecast made available prior to the flash flood event illustrated in FIG. 5.

FIG. 7 is a drawing illustrating an AccuWeather forecast 700 made available at 10:30 am prior to the flash flood event illustrated in FIG. 5. (The AccuWeather forecast 700 was based on the forecasted weather conditions 330 determined by the AccuWeather weather forecasting model 320.) The AccuWeather forecast 700 predicted far more rain in northern Missouri than other weather forecasting models. As illustrated in FIG. 7, the AccuWeather forecast 700 predicted between 14 and 15 inches of rain in geographic area 714 and between 15 and 16 inches of rain in geographic area 715. The AccuWeather forecast 700 included a reasonably accurate predicted location of heavy rainfall, as indicated by the geographic areas 714 and 715. However, AccuWeather forecast 700 predicted much more rain than the actual rainfall.

Figure 8:
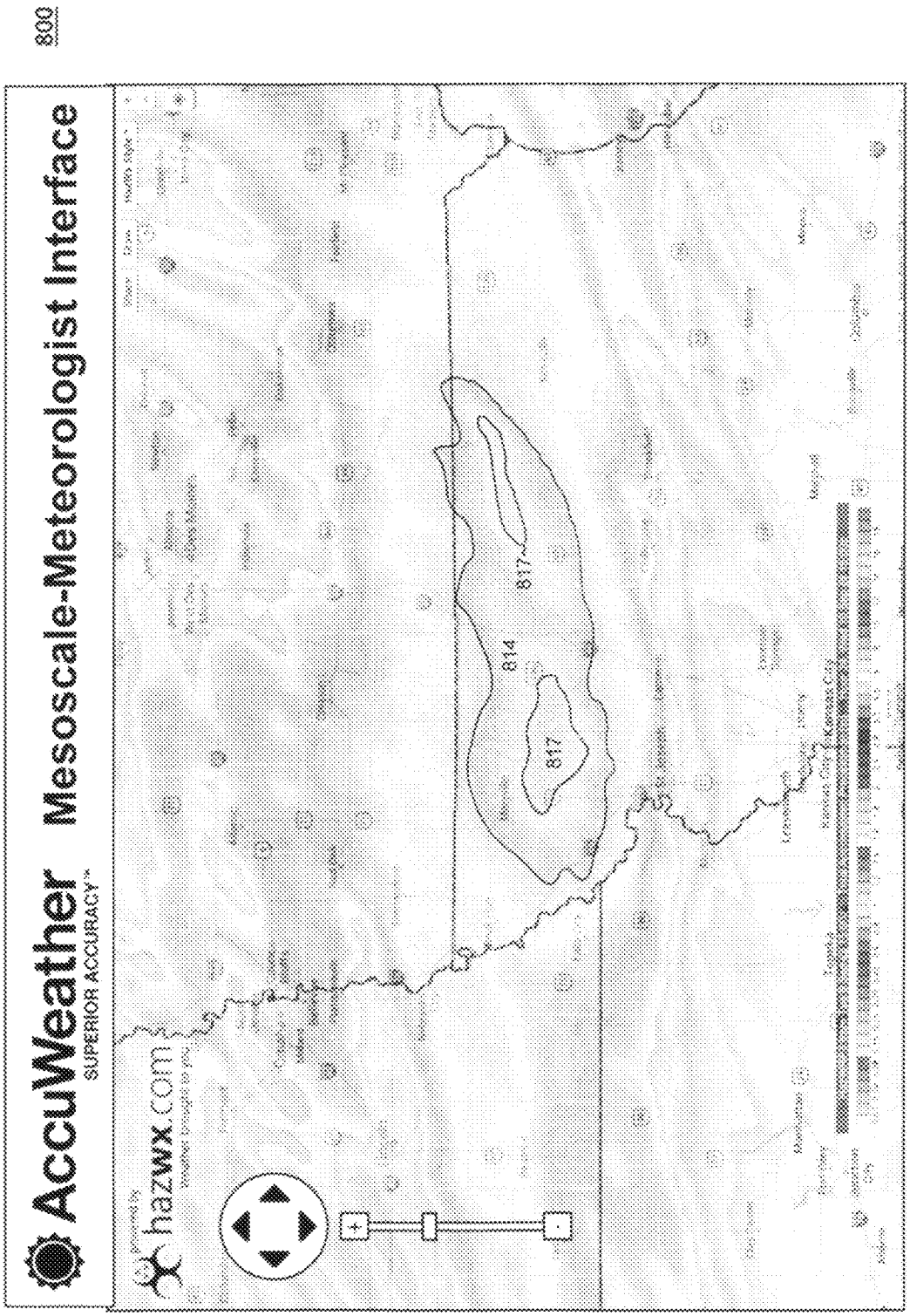
FIG. 8 is a drawing illustrating another AccuWeather forecast made available prior to the flash flood event illustrated in FIG. 5.

FIG. 8 is a drawing illustrating another AccuWeather forecast 800 made available around noon prior to the flash flood event illustrated in FIG. 5. (Again, the AccuWeather forecast 800 was based on the forecasted weather conditions 330 determined by the AccuWeather weather forecasting model 320.) As illustrated in FIG. 8, the AccuWeather forecast 800 predicted between 14 and 17 inches of rain in geographic area 814 and between 17 and 18 inches of rain in geographic area 718. Again, the AccuWeather forecast 800 included a reasonably accurate predicted location of heavy rainfall, but predicted much more rain (up to 18 inches) than actually fell.

The overestimation of the amount of rain was due to a bias referred to as "convective feedback," which is known to meteorologists.

Figure 9:
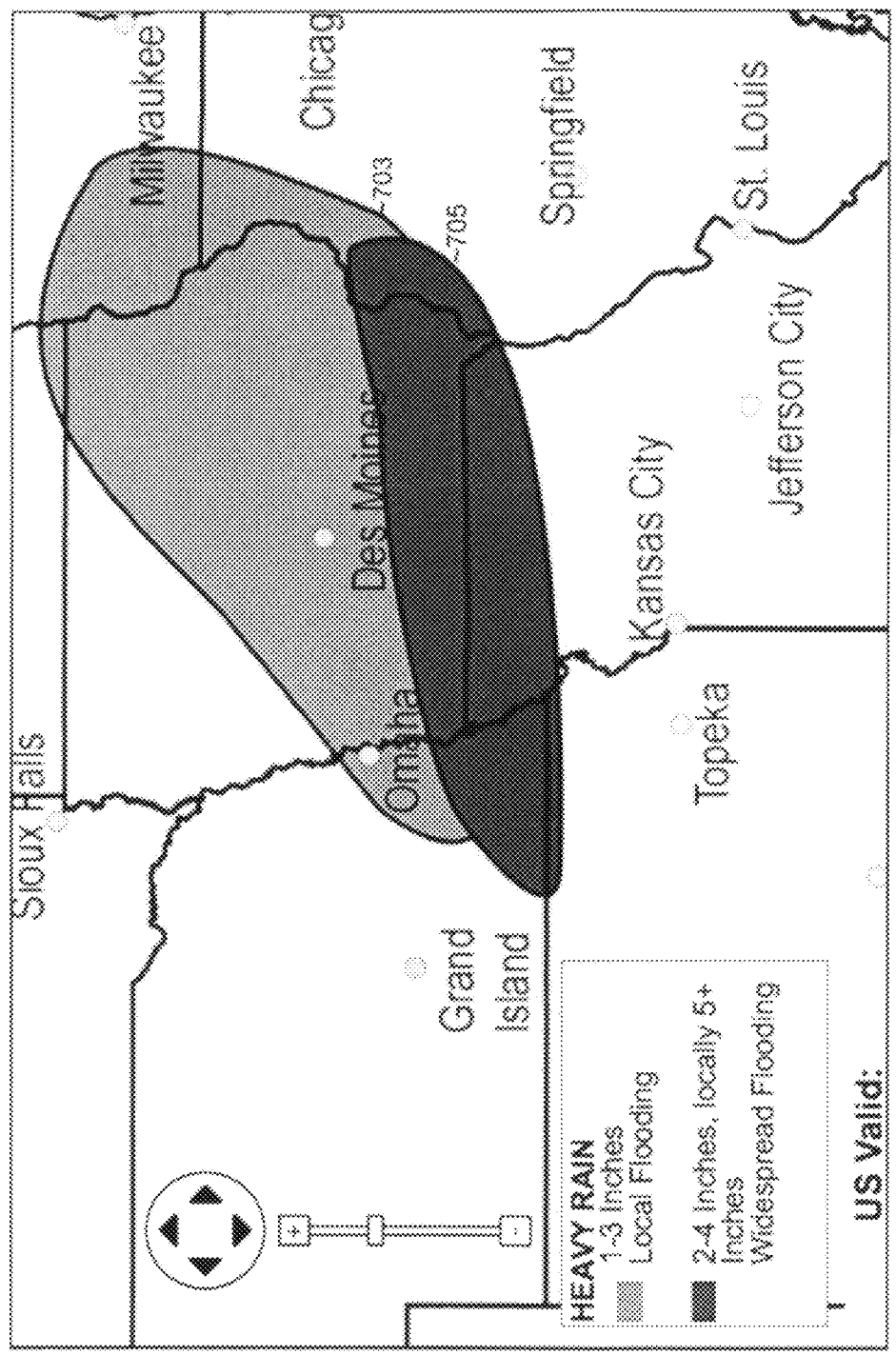
FIGS. 9 and 10 are drawings illustrating a storm potential notice issued prior to the flash flood event illustrated in FIG. 5.
Figure 10:
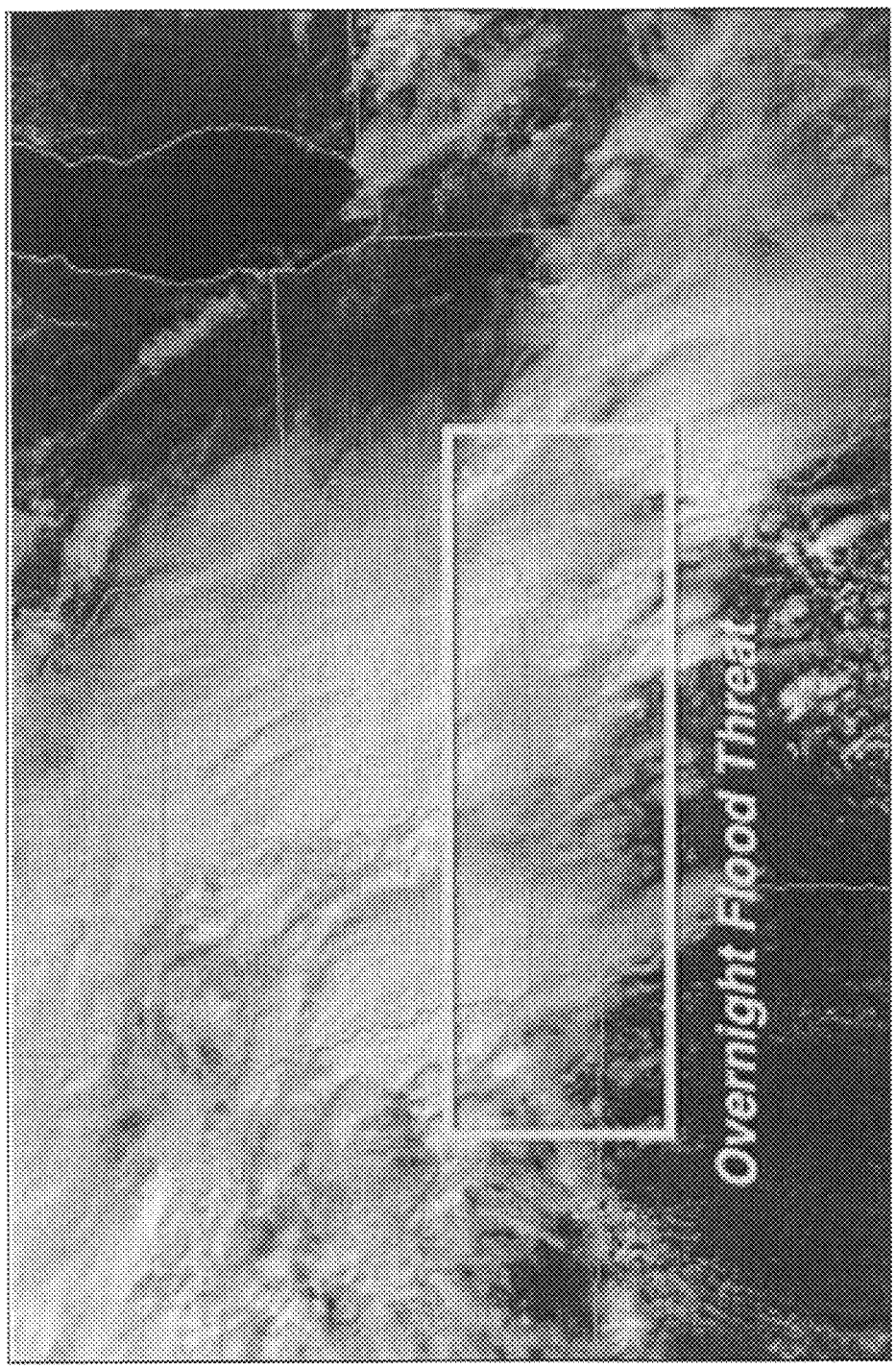

FIGS. 9 and 10 are drawings illustrating a storm potential notice issued prior to the flash flood event illustrated in FIG. 5. The storm potential notice correctly identified serious risk of heavy rains and overnight flooding. The storm potential notice, however, forecasted the heaviest rains along the Iowa-Missouri border rather than farther south in Missouri. Also, the storm potential notice indicated 5+ inches of rain.

The mesoscale modeling system 300 enables a meteorologist to prepare a forecast by averaging the outputs of two or more weather forecasting models. Had the AccuWeather weather forecasting model 320 illustrated in FIG. 8 been averaged with an additional model (such as the NWS model illustrated in FIG. 6), the mesoscale modeling system 300 would have accurately forecast rainfall in excess of 7 inches in northern Missouri and southern Iowa.

Figure 11:
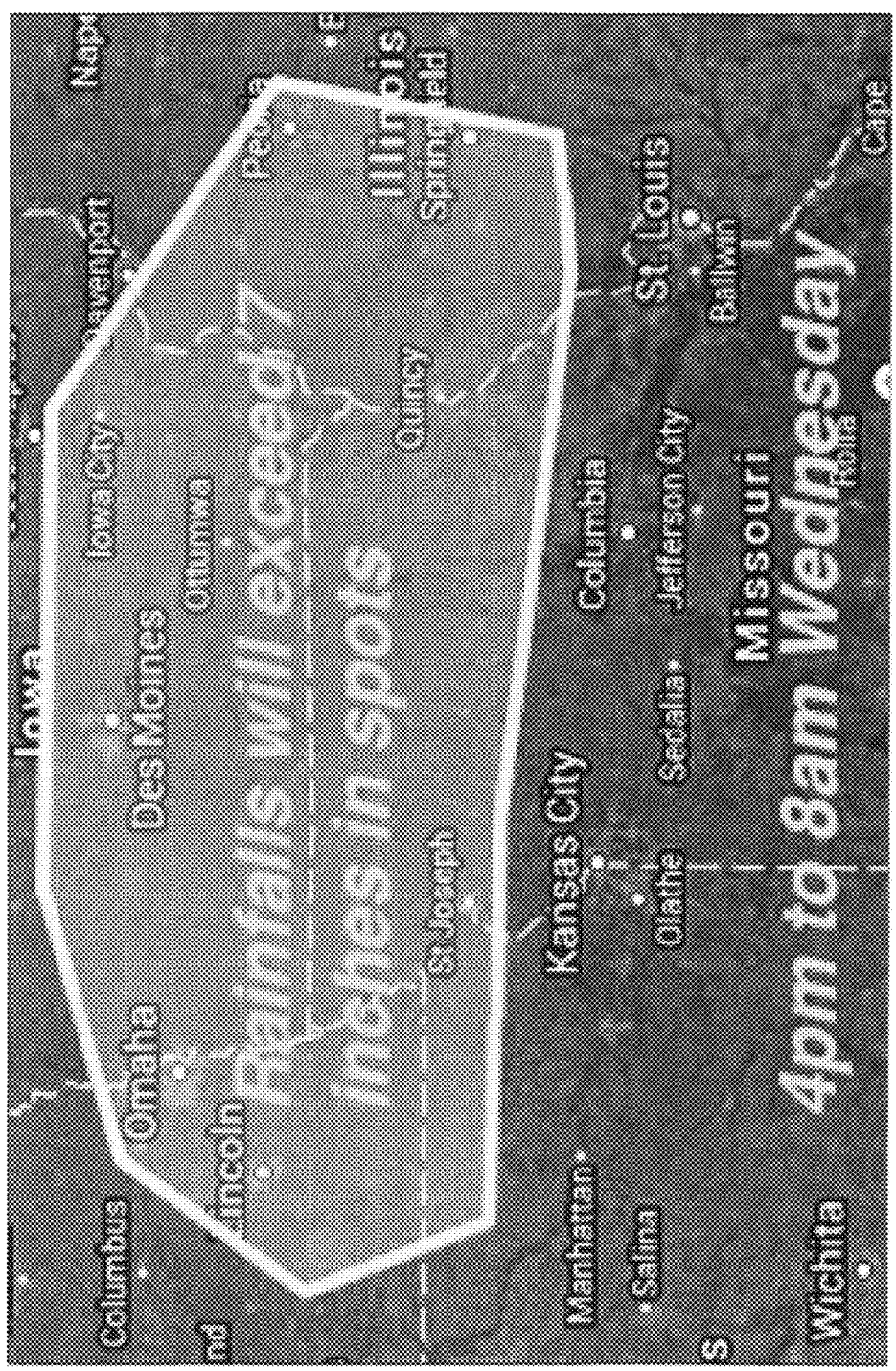
FIG. 11 is a drawing illustrating a prior art forecast.

FIG. 11 is a drawing illustrating a prior art forecast 1100. As shown in FIG. 11, in order for a meteorologist to output a forecast by adjusting and/or combining weather forecasting models using conventional methods, the meteorologist must draw polygons either by hand or using computer-aided design tools. As shown in FIG. 11, a meteorologist that recognizes the potential for rainfall in excess of 7 inches in northern Missouri and southern Iowa may do so by drawing a polygon. The prior art forecast 1100, however, lacks the resolution illustrated, for example, in FIGS. 7 and 8.

Figure 12:
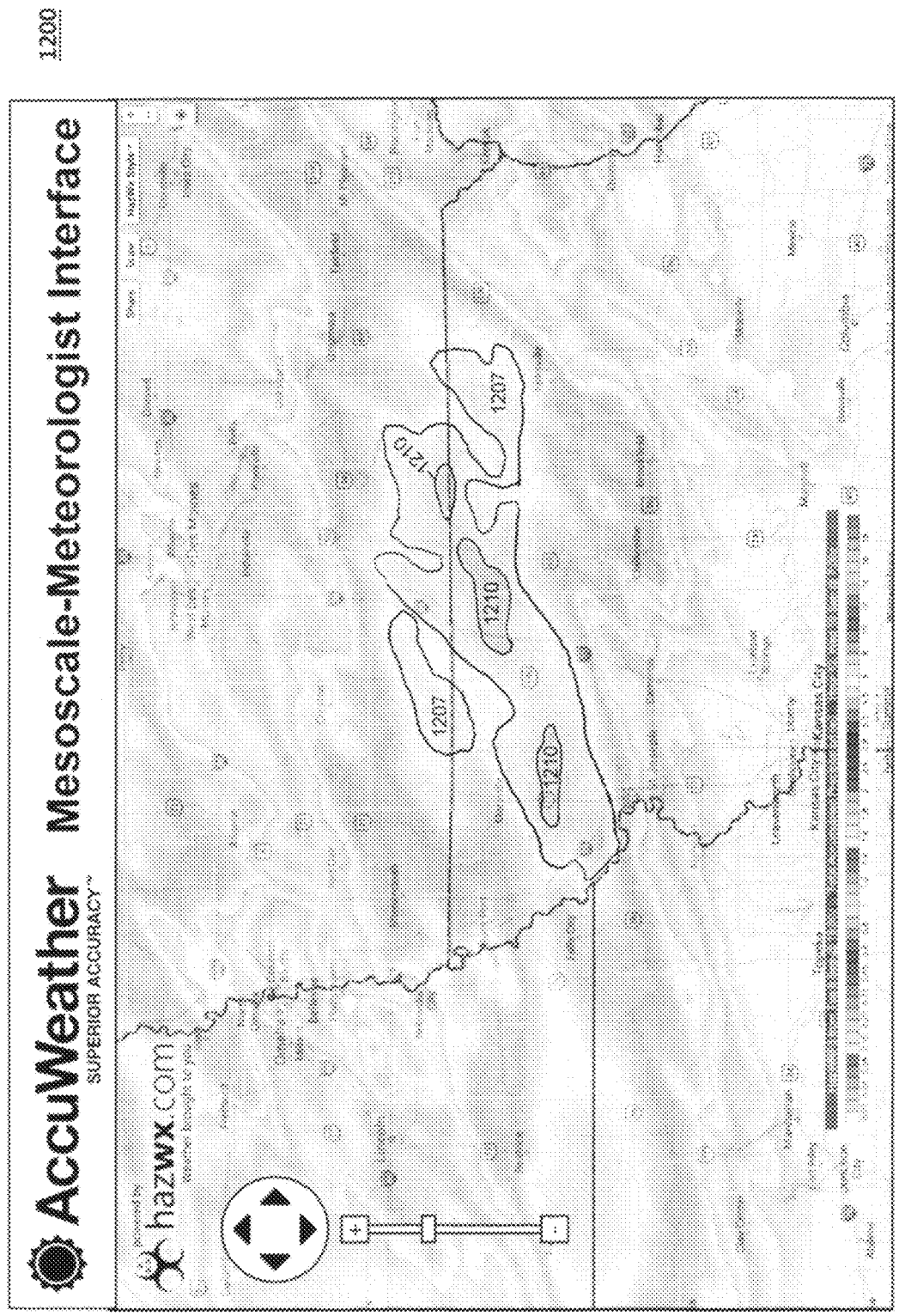
FIG. 12 is a drawing illustrating a forecast output by the graphical user interface of the mesoscale modeling system according to an exemplary embodiment of the present invention.

FIG. 12 is a drawing illustrating a forecast 1200 output by the graphical user interface 390 of the mesoscale modeling system 300 according to an exemplary embodiment of the present invention. As illustrated in FIG. 12, forecast includes a predicted rainfall between 7 and 10 inches in geographic areas 1107 and a predicted rainfall between 10 and 11 inches in geographic areas 1110. The mesoscale modeling system 300 may determine the potential for rainfall between 7 and 11 inches, for example, by averaging the output of the AccuWeather weather forecasting model 320 illustrated in FIG. 8 with an additional model (such as the NWS model illustrated in FIG. 6) to account for a known bias in the AccuWeather weather forecasting model. Additionally or alternatively, the mesoscale modeling system 300 may determine the potential for rainfall between 7 and 11 inches by reducing the intensity of the mesoscale weather system illustrated in FIG. 6 to account for a known bias.

Referring back to FIG. 1, there is shown a drawing of a view 100 of the graphical user interface 390 of the mesoscale modeling system 300 according to an exemplary embodiment of the present invention. The mesoscale modeling system 300 allows a user to receive forecasted weather conditions 330 determined by a weather forecasting model. The user selects a weather forecasting model as shown, for example, in row 110. The weather forecasting model may be a third party weather forecasting model (e.g., the 4 km NAM model, the HRRR model, etc.) or may be stored and executed by the mesoscale modeling system 300 (e.g., the AccuWeather weather forecasting model 320). Additionally, the mesoscale modeling system 300 may enable a user to select the current weather conditions 310 (for example, by selecting the current radar). Each weather forecasting model may determine forecasted weather conditions over a number of hours. The user may select one or more hours, for example, as shown in row 120.

The mesoscale modeling system 300 outputs the forecasted weather conditions 330 (as determined by the selected weather forecasting model) or the current weather conditions 310 (as determined by the current radar) to the user via the graphical user interface 390 as shown, for example, in FIG. 12.

The mesoscale modeling system 300 allows a user to adjust the forecasted weather conditions 330 by moving the predicted location of a mesoscale weather system. (Similarly, the mesoscale modeling system 300 allows a user to adjust the current weather conditions 310 by moving the current location of a mesoscale weather system.) The user may select a mesoscale weather system as shown, for example, in row 130 and move the selected mesoscale weather system using controls as shown, for example, in row 142. As illustrated in row 142, the mesoscale modeling system 300 allows a user to select a direction and distance to move the selected mesoscale weather system. Additionally or alternatively, the mesoscale modeling system 300 may allow the user to select and/or move a mesoscale modeling system by outputting a visual representation of the mesoscale weather system (as shown, for example, in FIG. 12) and providing functionality for the user to select the mesoscale modeling system using a mouse, touchpad, touchscreen, and/or other input device. The mesoscale modeling system 300 may also allow the user to move the selected mesoscale weather system by providing functionality for the user to drag the selected mesoscale weather system using the mouse, touchpad, touchscreen, etc., and/or move the selected mesoscale weather system using arrow keys of a keyboard or other input device.

The mesoscale modeling system 300 may also allow a user to adjust the forecasted weather conditions 330 by combining the output of two or more weather forecasting models. For example, a user may select the first weather forecasting model as shown in row 110 and a second weather forecasting model as shown in row 150. (Similarly, the mesoscale modeling system 300 may allow a user to adjust the current weather conditions 310 by combining the output of current radar selected in row 110 with the output of a weather forecasting model selected in row 150).

The mesoscale modeling system 300 may also allow a user to adjust the forecasted weather conditions 330 by adding a mesoscale weather system. A user may select a mesoscale weather system as shown, for example, in row 160 and may move the added mesoscale weather system using controls as shown, for example in row 144 (or using a mouse or other input device as described above with reference to row 142).

The mesoscale modeling system 300 may also allow a user to adjust the forecasted weather conditions 330 by adjusting the intensity of a mesoscale weather system. A user may adjust the intensity of the mesoscale weather system by increasing or decreasing the amount of rain and/or snow produced by the mesoscale weather system as shown, for example, in row 170.

The mesoscale modeling system may allow a user to output an adjusted forecast based on the adjusted weather conditions 330. A user may select a format in which to output the adjusted forecast as shown, for example, in area 180.

Using a weather forecasting model 320 stored and executed by the mesoscale modeling system 300, the mesoscale modeling system 300 may determine additional forecasted weather conditions 330 based at least in part on the adjustments described above. The user may input an instruction to run the weather forecasting model 320 based on the user adjustments, for example, by selected a button as shown in area 190. The mesoscale modeling system 300 may output an additional forecast, determined based on the additional forecasted weather conditions, to the user via the graphical user interface 390 as shown, for example, in FIG. 12.

While preferred embodiments have been set forth above, those skilled in the art who have reviewed the present disclosure will readily appreciate that other embodiments can be realized within the scope of the invention. For example, disclosures of specific numbers of hardware components, software modules and the like are illustrative rather than limiting. Therefore, the present invention should be construed as limited only by the appended claims.

What is claimed is:

1. A computer implemented-method, comprising:
providing functionality via a graphical user interface for a user to:
select two or more weather forecasting models; and
select a time period;
averaging the output of the two or more weather forecasting models;
receiving forecasted weather conditions, forecasted by the averaging of the output of the two or more weather forecasting models, for the selected time period;
providing functionality via the graphical user interface for the user to:
select an additional mesoscale weather system;
add the selected additional mesoscale weather system to the forecasted weather conditions;
move the added additional mesoscale weather system; and
adjust the intensity of the added additional mesoscale weather system; and
outputting a video broadcast that includes:
a map or image of a geographic area;
the forecasted weather conditions overlaid on a number of cells of the map or image of the geographic area in a resolution such that a forecasted mesoscale weather system is depicted in a predicted location on the map or image, each of the cells including information indicative of a predicted intensity of the forecasted mesoscale weather system; and the added additional mesoscale weather system.

2. The method of claim 1, wherein the graphical user interface further provides functionality for the user to adjust the predicted location of the forecasted mesoscale weather system.

3. The method of claim 1, wherein the graphical user interface further provides functionality for the user to adjust the predicted intensity of the forecasted mesoscale weather system.

4. The method of claim 3, wherein the predicted intensity of the forecasted mesoscale weather system comprises amounts of rain or snow predicted to fall in each of the cells of the map or image of the geographic area.

5. The method of claim 1, wherein the graphical user interface further provides functionality for the user to adjust a predicted duration of the forecasted mesoscale weather system.

6. The method of claim 1, wherein averaging the output of the two or more weather forecasting models comprises determining the predicted intensity of the forecasted mesoscale weather system by averaging the intensities predicted by the two or more weather forecasting models.

7. The method of claim 1, wherein averaging the output of the two or more weather forecasting models comprises determining the predicted location of the forecasted mesoscale weather system by averaging locations predicted by the two or more weather forecasting models.

8. The method of claim 1, further comprising providing functionality to use the weather forecasting model to determine future forecasted weather conditions based on the additional mesoscale weather system added by the user.

9. A mesoscale modeling system, comprising:
a database that store forecasted weather conditions forecasted by a plurality of weather forecasting models,
a graphical user interface that provides functionality for a user to:
select two or more weather forecasting models; and
select a time period;
an analysis unit that:
averages the output of the two or more weather forecasting models;
receives the forecasted weather conditions, for the selected time period, forecasted by the averaging of the output of the two or more weather forecasting models;
the graphical user interface further providing functionality for the user to:
select an additional mesoscale weather system;
add the selected additional mesoscale weather system to the forecasted weather conditions;
move the added additional mesoscale weather system; and
adjust the intensity of the added additional mesoscale weather system; and
the analysis unit outputting a video broadcast that includes:
a map or image of a geographic area;
the forecasted weather conditions overlaid on a number of cells of the map or image of the geographic area in a resolution such that a forecasted mesoscale weather system is depicted in a predicted location on the map or image, each of the cells including information indicative of a predictive intensity of the mesoscale weather system; and the added additional mesoscale weather system.

10. The system of claim 9, wherein the graphical user interface further provides functionality for the user to adjust the predicted location of the forecasted mesoscale weather system.

11. The system of claim 9, wherein the graphic user interface further provides functionality for the user to adjust the predicted location of the forecasted mesoscale weather system.

12. The system of claim 11, wherein the predicted intensity of the forecasted mesoscale weather system comprises amounts of rain or snow predicted to fall in each of the cells of the map or image of the geographic area.

13. The system of claim 9, wherein the graphical user interface further provides functionality for the user to adjust a predicted duration of the forecasted mesoscale weather system.

14. The system of claim 9, wherein averaging the output of the two or more weather forecasting models comprises determining the predicted intensity of the forecasted mesoscale weather system by averaging the intensities predicted by the two or more weather forecasting models.

15. The system of claim 9, wherein averaging the output of the two or more weather forecasting models comprises determining the predicted location of the forecasted mesoscale weather system by averaging locations predicted by the two or more weather forecasting models.

16. The system of claim 9, wherein the system provides functionality for the user to use the weather forecasting model to determine future forecasted weather conditions based on the additional mesoscale weather system added by the user.

* * * * *